US012690139B2

(12) United States Patent
Pao et al.

(10) Patent No.: US 12,690,139 B2
(45) Date of Patent: Jul. 21, 2026

(54) METHOD FOR MANUFACTURING A PRINTED CIRCUIT BOARD WITH AN EMBEDDED SHIELD

(71) Applicant: Hitron Technologies Inc., Hsinchu City (TW)

(72) Inventors: Kuo-Hao Pao, Hsinchu City (TW); Yu-Cheng Lin, Hsinchu City (TW)

( * ) Notice: Subject to any disclaimer, the term of this patent is extended or adjusted under 35 U.S.C. 154(b) by 0 days.

(21) Appl. No.: 18/399,711

(22) Filed: Dec. 29, 2023

(65) Prior Publication Data

US 2025/0220823 A1 Jul. 3, 2025

(51) Int. Cl.
| | |
|---|---|
| *H05K 9/00* | (2006.01) |
| *H05K 1/02* | (2006.01) |
| *H05K 3/3494* | (2026.01) |
| *H05K 3/00* | (2006.01) |

(52) U.S. Cl.
CPC ........... *H05K 3/3494* (2013.01); *H05K 1/023* (2013.01); *H05K 9/0024* (2013.01); *H05K 3/0026* (2013.01); *H05K 3/0044* (2013.01); *H05K 2201/09036* (2013.01); *H05K 2201/10371* (2013.01); *H05K 2203/0723* (2013.01); *H05K 2203/143* (2013.01)

(58) Field of Classification Search
CPC .................................................... H05K 9/0024
See application file for complete search history.

(56) References Cited

U.S. PATENT DOCUMENTS

| | | | |
|---|---|---|---|
| 2009/0231825 A1* | 9/2009 | Li | H05K 9/0028 |
| | | | 361/818 |
| 2018/0053731 A1* | 2/2018 | Sommer | H01L 21/565 |
| 2019/0307029 A1* | 10/2019 | Hannan | H05K 1/183 |

FOREIGN PATENT DOCUMENTS

| | | |
|---|---|---|
| CN | 1976396 A | 6/2007 |
| CN | 114080092 A | 2/2022 |
| TW | 202135396 A | 9/2021 |

OTHER PUBLICATIONS

Office Action dated Jul. 1, 2025, issued in counterpart Taiwanese Patent Application No. 113113931.
Office Action of 113113931 From Taiwan Intellectual Property Office.
Office Action of Application No. 113113931 from the Taiwan Intellectual Property Office.

* cited by examiner

*Primary Examiner* — Hung V Ngo
(74) *Attorney, Agent, or Firm* — OPES IP Consulting Co., Ltd.

(57) ABSTRACT

This invention introduces an advanced method for manufacturing printed circuit boards (PCBs) featuring an embedded shield, enhancing the integrity and functionality of electronic devices. The process involves forming trenches on the PCB, filling them with solder paste, and seamlessly integrating a shield with a frame through a meticulous soldering procedure. This refined technique offers superior reliability and paves the way for more intricate and robust electronic designs.

12 Claims, 2 Drawing Sheets

Trench

FIG. 2B

Solder paste

FIG. 2D

Frame

Solder paste

FIG. 2F

Foils

Dielectrics

FIG. 2A

Metal layer

FIG. 2C

Frame

Solder paste

FIG. 2E

METHOD FOR MANUFACTURING A PRINTED CIRCUIT BOARD WITH AN EMBEDDED SHIELD

BACKGROUND OF THE INVENTION

In the ever-advancing realm of electronics, the intricacies of modern circuitry have reached unprecedented heights. As the complexity of circuits increases and transmission speeds accelerate, the need for robust solutions to prevent signal interference has become paramount in the field of Printed Circuit Board (PCB) manufacturing. As we delve deeper into an era characterized by higher circuit complexity and unprecedented transmission speeds, the significance of robust solutions to counter signal interference in PCBs becomes increasingly apparent.

In response to this demand, metal shielding has emerged as a critical component in ensuring the reliability and performance of electronic devices. Metal shielding is a linchpin in ensuring the reliability and performance of electronic devices, has become a pivotal element in the evolution of PCB manufacturing. Its role extends beyond mere protection against external signals that could disrupt the delicate dance of circuitry; it is equally vital in preventing internal interference that might compromise the functionality of neighboring components.

Whether shielding against external signals that might disrupt delicate circuitry or preventing internal interference that could affect neighboring components, the role of metal shielding in PCBs is indispensable.

To guarantee minimal interference, shielding frames are meticulously sealed around the circuit board, with tin soldered onto the board's surface. This sealing process is crucial, as it not only prevents electromagnetic wave leakage but also shields against external noise, safeguarding the integrity of the signals coursing through the circuit.

In the quest for minimal interference, the meticulous sealing of shielding frames around the circuit board, with precise tin solder application onto the board's surface, has become a hallmark of advanced PCB manufacturing. This sealing process not only shields against electromagnetic wave leakage but also acts as a formidable defense against external noise, safeguarding the integrity of signals coursing through the intricate pathways of the circuit.

Effectively blocking signal interference mandates a seamless connection between the metal shielding and the circuit board's metal layer. The adoption of Surface Mount Technology (SMT) as a prevalent industry practice underscores the commitment to precision, with the shielding frame soldered onto the exposed solder pads on the PCB surface. This method ensures a robust and integral connection, minimizing the risk of interference and upholding the high standards of modern electronics.

However, the journey through the landscape of PCB manufacturing is not devoid of challenges. The production process introduces variables such as manufacturing tolerances and uneven conditions, resulting in the existence of small yet impactful gaps between the shielding frame and the circuit board. This emphasizes the industry's continuous pursuit of precision, urging manufacturers to refine processes and techniques to mitigate these challenges and maintain the integrity of the final product.

The industry has commendably surmounted challenges posed by the relatively smaller dimensions of shielding frames. The existing SMT production process capabilities and optimization techniques have demonstrated efficacy in meeting the stringent requirements of sealing the shielding frame with tin solder onto the circuit board. These achievements translate into minimized deviations and deformations in the production size, ensuring a high level of reliability in the finished products that populate our technological landscape.

Looking forward, the landscape of PCB manufacturing is poised for further evolution. The ever-increasing complexity of circuits necessitates larger shielding frames, presenting a new set of challenges. The current SMT production process capabilities and optimization techniques may face limitations when dealing with larger frames, potentially leading to soldering defects and reduced production yield. The industry must now grapple with finding innovative solutions to overcome these challenges and maintain the high standards of performance and reliability expected in modern electronics.

The journey of PCB manufacturing is a dynamic interplay of innovation and challenges. The meticulous integration of metal shielding into circuit design reflects the industry's commitment to delivering electronics that stand resilient against the complexities of the modern world. As technology continues to advance, the field will undoubtedly witness further breakthroughs, ensuring the continued reliability and efficiency of the electronic devices that have become integral to our daily lives.

SUMMARY OF THE INVENTION

One of the aspects of the present invention is to provide a method for manufacturing a printed circuit board (PCB) with an embedded shield, comprising: providing a PCB; forming at least one trench at the PCB; filling a solder paste in the at least one trench; disposing a shield with at least one frame on the PCB; and soldering the PCB with the shield; wherein the frame of the shield is disposed in the trench and a portion of the frame is immersed in the solder paste.

Preferably, in the step of forming the trench at the PCB, the trench is formed by CNC milling (computer numerical control milling) process, laser carving or engraving process.

Preferably, after the trench is formed at the PCB, the trench is electroplated with a metal layer.

Preferably, the metal layer is made of copper, gold, nickel, ENG (electrolytic nickel/gold), ENIG (electroless nickel immersion gold), HASL (hot-air solder leveling).

Preferably, after the frame of the shield is immersed in the solder paste, the PCB is heated through a heating device.

Preferably, the heating device is a reflow oven.

Preferably, the solder paste is melted to secure the frame of the shield to the PCB via the melted solder paste in the trench.

One another aspect of the present invention is to provide a PCB with an embedded shielding, comprising: a PCB having at least one trench formed thereon; a shield with at least one frame, wherein the shield is disposed at the PCB; and a solder paste filled in the trench; wherein the frame of the shield is disposed in the trench and a portion of the frame is immersed in the solder paste.

Preferably, the trench is formed by CNC milling (computer numerical control milling) process, laser carving or engraving process.

Preferably, the trench at the PCB is electroplated with a metal layer.

Preferably, the metal layer is made of copper, gold, Nickel, ENG (electrolytic nickel/gold), ENIG (electroless nickel immersion gold), HASL (hot-air solder leveling).

Preferably, the PCB is heated through a heating device.

Preferably, the heating device is a reflow oven.

Preferably, the solder paste is melted to secure the frame of the shield to the PCB via the melted solder paste in the trench.

BRIEF DESCRIPTION OF DRAWINGS

FIG. 2A to 2F illustrate an embodiment of method for manufacturing a printed circuit board (PCB) with an embedded shield of the present invention.

DETAILED DESCRIPTION OF THE INVENTION

Figure 1:
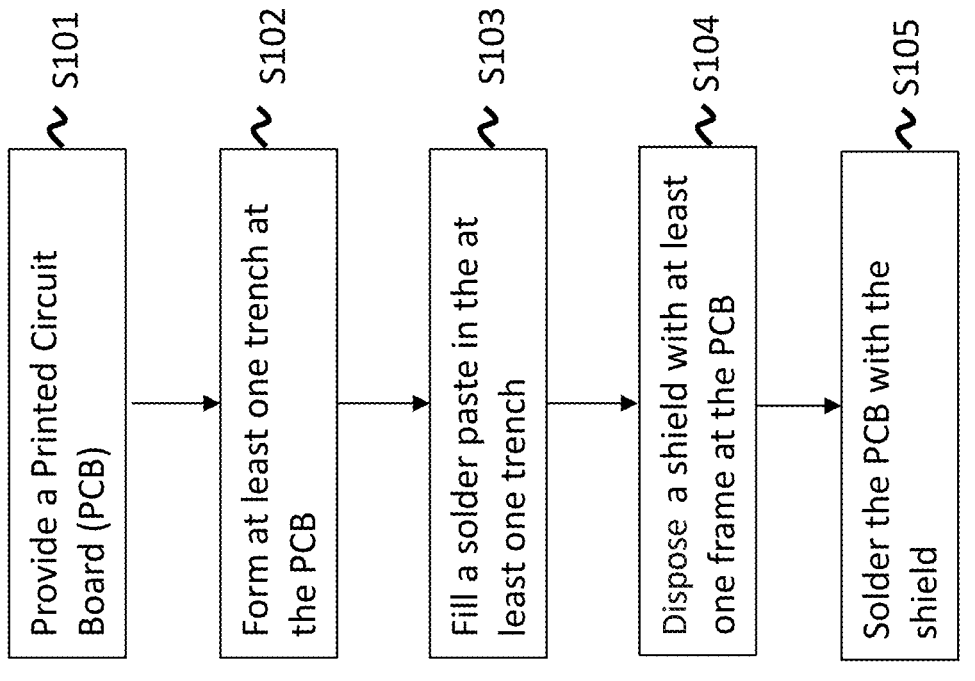
FIG. 1 illustrates the manufacturing process of the present invention.

This invention introduces an advanced method for manufacturing printed circuit boards (PCBs) featuring an embedded shield, enhancing the integrity and functionality of electronic devices. The process involves forming trenches on the PCB, filling them with solder paste, and seamlessly integrating a shield, which includes a frame, with the PCB through a meticulous soldering procedure. This refined technique offers superior reliability and paves the way for more intricate and robust electronic designs.

This invention revolutionizes PCB manufacturing, offering a methodical approach to embed shielding for heightened signal integrity and reduced interference. The following description delves into the steps outlined in FIG. 1, illustrating the manufacturing process. The follow paragraphs will be described with FIG. 1 collectively referred.

In the initial step S101, provide a Printed Circuit Board (PCB), that is, a PCB is procured, following a conventional manufacturing process that may involve creating multiple layers for enhanced functionality. Moving to step S102, form at least one trench at the PCB. The innovation unfolds as at least one trench is meticulously formed on the PCB. The versatility of this method is highlighted as it accommodates scenarios with a singular trench or, alternatively, a plurality of trenches. The specific quantity is determined by the unique requirements of each case. Techniques such as CNC milling, laser carving, or engraving are employed in this trench-forming process, showcasing the adaptability of the approach to various manufacturing technologies.

Advancing to step S103, fill a solder paste in the at least one trench. Solder paste is applied within the formed trench, a critical stage ensuring a strong and reliable bond. In the subsequent step, S104, dispose a shield with at least one frame at the PCB. A shield equipped with at least one frame is strategically positioned on the PCB. Notably, the frame is carefully disposed within the plurality of trenches, with a segment immersed in the previously applied solder paste. This innovative configuration enhances the structural integrity of the shield on the PCB.

In select embodiments, an additional layer of refinement is introduced in step S103. Before the trench is filled with solder paste, the trench undergoes electroplating with a metal layer. This layer, boasting versatility and resilience, may consist of materials such as copper, gold, nickel, ENG (electrolytic nickel/gold), ENIG (electroless nickel immersion gold), or HASL (hot-air solder leveling). This electroplating step augments the overall durability and conductivity of the embedded shield.

The final step, S105, solder the PCB with the shield. The final step S105 involves subjecting the assembled PCB and shield to a soldering procedure. A heating device, in this instance, exemplified by a reflow oven, is utilized for controlled and precise heating. This carefully orchestrated heating process melts the solder paste, effectively securing the frame of the shield to the PCB within the trenches. This meticulous soldering procedure ensures a robust and reliable connection, a crucial factor for the optimal functionality of the PCB with embedded shielding.

This refined method not only showcases adaptability to diverse PCB designs but also emphasizes precision and innovation in the integration of shielding components, laying the foundation for enhanced reliability and reduced interference in electronic devices.

Reference is next collectively made to FIGS. 2A to 2F, which illustrate an embodiment of method for manufacturing a printed circuit board (PCB) with an embedded shield of the present invention.

Illustrative Embodiment of PCB Manufacturing with Embedded Shield

FIGS. 2A to 2F collectively portray an embodiment of the innovative method for manufacturing a printed circuit board (PCB) with an embedded shield. This description provides a detailed walkthrough of the sequential steps involved in the process.

Figures 2A, 2B, 2C, 2D, 2E, 2F:
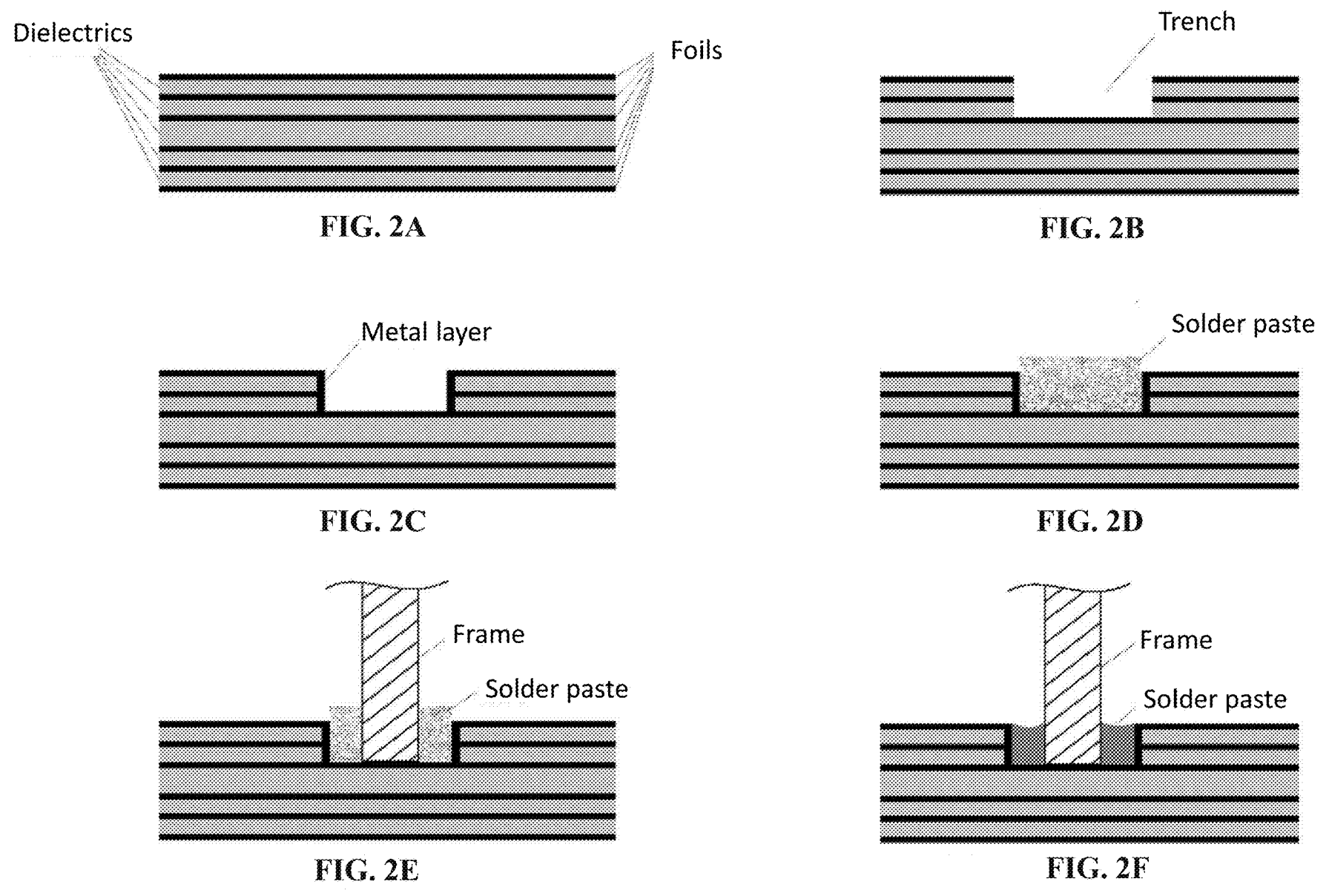

PCB Composition and Trench Formation (FIGS. 2A and 2B):

Commencing with FIG. 2A, a multi-layered PCB is introduced. Comprising multiple layers of foils, preferably copper foils, the PCB is characterized by dielectrics seamlessly filling the spaces between these foil layers. Moving to FIG. 2B, a pivotal step unfolds as a trench is meticulously formed on the PCB. The trench creation process is not limited to a specific method but includes options such as CNC milling, laser carving, or engraving, showcasing adaptability to various manufacturing technologies.

Electroplating and Metal Layer Application (FIG. 2C):

In FIG. 2C, attention shifts to electroplating the formed trench with a versatile metal layer. The options for this metal layer include copper, gold, nickel, ENG (electrolytic nickel/gold), ENIG (electroless nickel immersion gold), or HASL (hot-air solder leveling). This electroplating step significantly contributes to the overall conductivity and durability of the embedded shield structure.

Solder Paste Application, Shield Placement, and Heating (FIGS. 2D to 2F):

Continuing to FIG. 2D, solder paste is meticulously applied within the electroplated trench, a critical phase ensuring a robust connection. In FIG. 2E, a shield, featuring at least one frame, is strategically positioned on the PCB. While not illustrated in this figure, the shield becomes an integral part of the structure.

The structured assembly (FIG. 2E) undergoes a controlled heating or baking process, preferably facilitated by a reflow oven, as depicted in FIG. 2F. Through this precise heating procedure, the solder paste undergoes a melting phase, securing the frame of the shield to the PCB within the trench. This final step ensures a durable, reliable connection, culminating in a PCB with an embedded shield ready to meet the demands of modern electronics.

This illustrative embodiment showcases the seamless integration of shielding components into the PCB manufacturing process, promising enhanced conductivity, durability, and reduced interference in electronic devices.

The invention claimed is:

1. A method for manufacturing a printed circuit board (PCB) with an embedded shield, comprising:

providing a PCB;

forming at least one trench at the PCB;

electroplating the trench with a metal layer to form an electroplated trench;

filling a solder paste in the electroplated trench;

disposing a shield with at least one frame at the PCB; and soldering the PCB with the shield;

wherein the frame of the shield is disposed in the electroplated trench, and a portion of the frame is immersed in the solder paste, such that the frame of the shield is seamlessly integrated with the metal layer.

2. The method for manufacturing the PCB with the embedded shield according to claim 1, wherein in the step of forming the trench at the PCB, the trench is formed by CNC milling (computer numerical control milling) process, laser carving or engraving process.

3. The method for manufacturing the PCB with the embedded shield according to claim 1, wherein the metal layer is made of copper, gold, nickel, ENG (electrolytic nickel/gold), ENIG (electroless nickel immersion gold), or HASL (hot-air solder leveling).

4. The method for manufacturing the PCB with the embedded shield according to claim 1, wherein after the frame of the shield is immersed in the solder paste, the PCB is heated through a heating device.

5. The method for manufacturing the PCB with the embedded shield according to claim 4, wherein the heating device is a reflow oven.

6. The method for manufacturing the PCB with the embedded shield according to claim 4, wherein the solder paste is melted to secure the frame of the shield to the PCB via the melted solder paste in the electroplated trench.

7. A PCB with an embedded shield, comprising:

a PCB having at least one trench formed thereon, the trench being electroplated with a metal layer;

a shield with at least one frame, wherein the shield is disposed at and soldered to the PCB; and a solder paste filled in the electroplated trench;

wherein the frame of the shield is disposed in the electroplated trench, and a portion of the frame is immersed in the solder paste, such that the frame of the shield is seamlessly integrated with the metal layer.

8. The PCB with the embedded shield according to claim 7, wherein the trench is formed by CNC milling (computer numerical control milling) process, laser carving or engraving process.

9. The PCB with the embedded shield according to claim 7, wherein the metal layer is made of copper, gold, nickel, ENG (electrolytic nickel/gold), ENIG (electroless nickel immersion gold), or HASL (hot-air solder leveling).

10. The PCB with the embedded shield according to claim 7, wherein the PCB is heated through a heating hating-device.

11. The PCB with the embedded shield according to claim 10, wherein the heating device is a reflow oven.

12. The PCB with the embedded shield according to claim 10, wherein the solder paste is melted to secure the frame of the shield to the PCB via the melted solder paste in the electroplated trench.

* * * * *